US008854121B2

(12) United States Patent
Duggal

(10) Patent No.: US 8,854,121 B2
(45) Date of Patent: Oct. 7, 2014

(54) SELF-CALIBRATING DIFFERENTIAL CURRENT CIRCUIT

(75) Inventor: Abhishek Duggal, Emmaus, PA (US)

(73) Assignee: LSI Corporation, San Jose, CA (US)

( * ) Notice: Subject to any disclaimer, the term of this patent is extended or adjusted under 35 U.S.C. 154(b) by 349 days.

(21) Appl. No.: 13/472,537

(22) Filed: May 16, 2012

(65) Prior Publication Data

US 2013/0307518 A1 Nov. 21, 2013

(51) Int. Cl.
*H05K 5/00* (2006.01)

(52) U.S. Cl.
USPC .......... 327/539; 323/317

(58) Field of Classification Search
USPC ......... 323/222, 224, 282–289, 312, 314–317; 327/73, 78, 109, 110, 206, 312, 360, 327/530, 535, 539, 546; 330/253, 255, 257, 330/277
See application file for complete search history.

(56) References Cited

U.S. PATENT DOCUMENTS

| | | | | |
|---|---|---|---|---|
| 5,245,344 | A * | 9/1993 | Sooch | 341/150 |
| 7,474,086 | B2 * | 1/2009 | Chen et al. | 323/288 |
| 7,733,157 | B2 * | 6/2010 | Brederlow et al. | 327/427 |
| 7,834,824 | B2 * | 11/2010 | Routley et al. | 345/77 |

* cited by examiner

*Primary Examiner* — Rajnikant Patel
(74) *Attorney, Agent, or Firm* — Mendelsohn, Drucker & Dunleavy, P.C.; Steve Mendelsohn

(57) ABSTRACT

In one embodiment, a constant-current generator is connected in series with a dependent (e.g., tail) device. A switched capacitor circuit connected to the gate of the dependent device is operated to (i) charge at least one capacitor of the switched capacitor circuit, (ii) use the at least one charged capacitor to adjust the gate voltage of the dependent device to drive the dependent current through the dependent device to be equal to the constant current through the constant-current generator, and (iii) direct the dependent and constant currents through source and sink current nodes.

10 Claims, 2 Drawing Sheets

200

100

200

SELF-CALIBRATING DIFFERENTIAL CURRENT CIRCUIT

BACKGROUND

This section introduces aspects that may help facilitate a better understanding of the invention. Accordingly, the statements of this section are to be read in this light and are not to be understood as admissions about what is prior art or what is not prior art.

A differential current circuit is a circuit that simultaneously generates a pair of currents: an outgoing source current and an incoming sink current. The goal of a differential current circuit is to generate precisely matched source and sink currents that have identical magnitudes.

FIG. 1 shows a schematic circuit diagram of conventional differential current circuit 100, which generates source current Isource and sink current Isink In circuit 100, PMOS devices Pm, Ps1, and Ps2 are configured as current mirrors, where the current Iin through master device Pm is mirrored by the currents through both the first slave device Ps1 and the second slave device Ps2 and where the mirrored current through device Ps2 is the source current Isource for circuit 100. The mirrored current through the first slave device Ps1 passes through the first NMOS tail device Nt1. With their gates interconnected and their sources both connected to ground, the current through the first tail device Nt1 is mirrored by the current through the second NMOS tail device Nt2, which is the sink current Isink for circuit 100.

Under ideal conditions, the source current Isource and the sink current Isink generated by differential current circuit 100 would have identical magnitudes. However, in the real-world implementations, processing mismatches and drain voltage differences between the PMOS devices, Ps2 and Ps1, and, similarly, between the NMOS devices, Nt2 and Nt1, lead to a mismatch between the magnitudes of those source and sink currents.

SUMMARY

In one embodiment, the invention is an integrated circuit having a differential current circuit for generating a source current at a source current node and a sink current at a sink current node. The differential current circuit comprises a constant-current generator, a dependent device, and a switched capacitor circuit. The constant-current generator is adapted to generate a constant current. One of the source current and the sink current is the constant current, and the other of the source current and the sink current is a dependent current through the dependent device. The switched capacitor circuit is connected to a gate of the dependent device, where the switched capacitor circuit is configured to be operated to (i) charge at least one capacitor of the switched capacitor circuit, (ii) use the at least one charged capacitor to adjust a gate voltage of the dependent device to drive the dependent current through the dependent device to be equal to the constant current through the constant-current generator, and (iii) direct the dependent and constant currents through the source and sink current nodes.

BRIEF DESCRIPTION OF THE DRAWINGS

Other embodiments of the disclosure will become more fully apparent from the following detailed description, the appended claims, and the accompanying drawings in which like reference numerals identify similar or identical elements.

DETAILED DESCRIPTION

Figure 1:
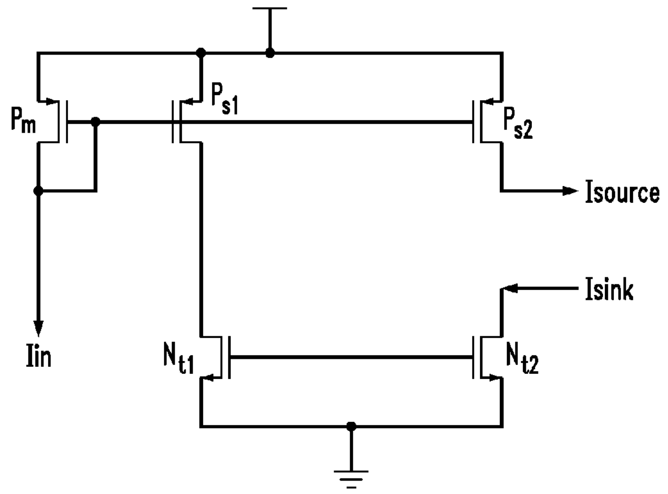
FIG. 1 PRIOR ART
FIG. 1 shows a schematic circuit diagram of a conventional differential current circuit that generates source current Isource and sink current Isink.
Figure 2:
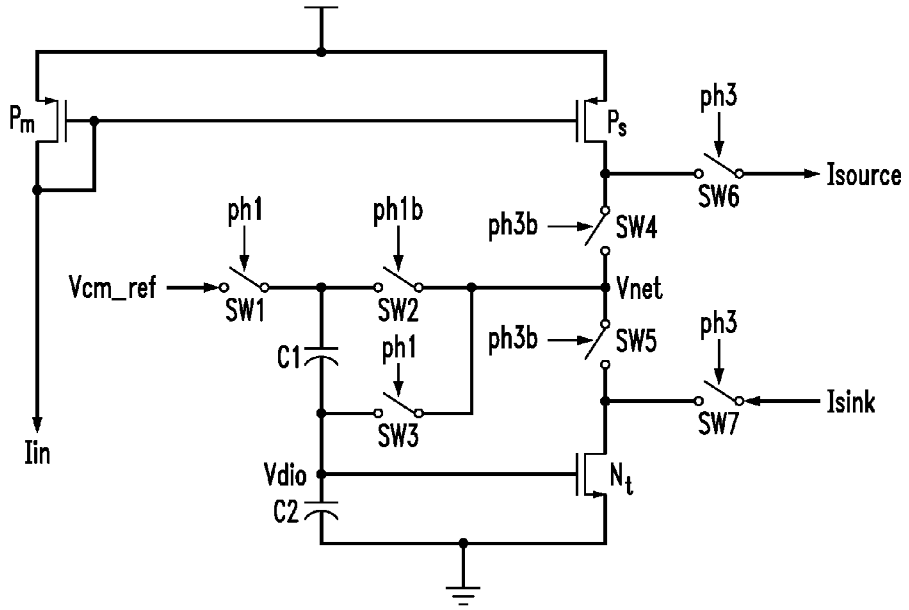
FIG. 2 shows a schematic circuit diagram of a self-calibrating differential current circuit that generates source current Isource and sink current Isink, according to one embodiment of the disclosure.

FIG. 2 shows a schematic circuit diagram of self-calibrating differential current circuit 200, which generates source current Isource and sink current Isink, according to one embodiment of the disclosure. In circuit 200, PMOS devices Pm and Ps are configured as a current mirror, where the current Iin through master device Pm is mirrored by the current through slave device Ps. When switch SW4 is open (off) and switch SW6 is closed (on), the mirrored current through slave device Ps is the output source current Isource for circuit 200. Similarly, when switch SW5 is open (off) and switch SW7 is closed (on), the current through NMOS tail device Nt is the output sink current Isink for circuit 200.

The states (i.e., open or closed) of the seven switches SW1-SW7 in circuit 200 are controlled by two complementary pairs of phased control signals: a first complementary pair ph1 and ph1*b*, where ph1*b* is the inverse of ph1, and a second complementary pair ph3 and ph3*b*, where ph3*b* is the inverse of ph3. As referred to in this disclosure, when a control signal is high (logic 1), a corresponding switch is closed (i.e., conducting), and, when the control signal is low (logic 0), the corresponding switch is open (i.e., non-conducting). In an alternative, logic-low implementation, a low control signal closes a corresponding switch, and vice versa.

Typically, in a differential circuit, the average voltage for any pair of differential signals is constant, and this fixed average voltage is called the common-mode voltage for that differential pair of signals. In general, different pairs may have different constant common-mode voltages. Circuit 200 uses a fixed common-mode reference voltage, Vcm_ref, which is chosen to be equal to the fixed average voltage of differential output nodes, Isource and Isink, where:

$$Vcm\_ref=(V\_Isource+V\_Isink)/2.$$

Figure 3:
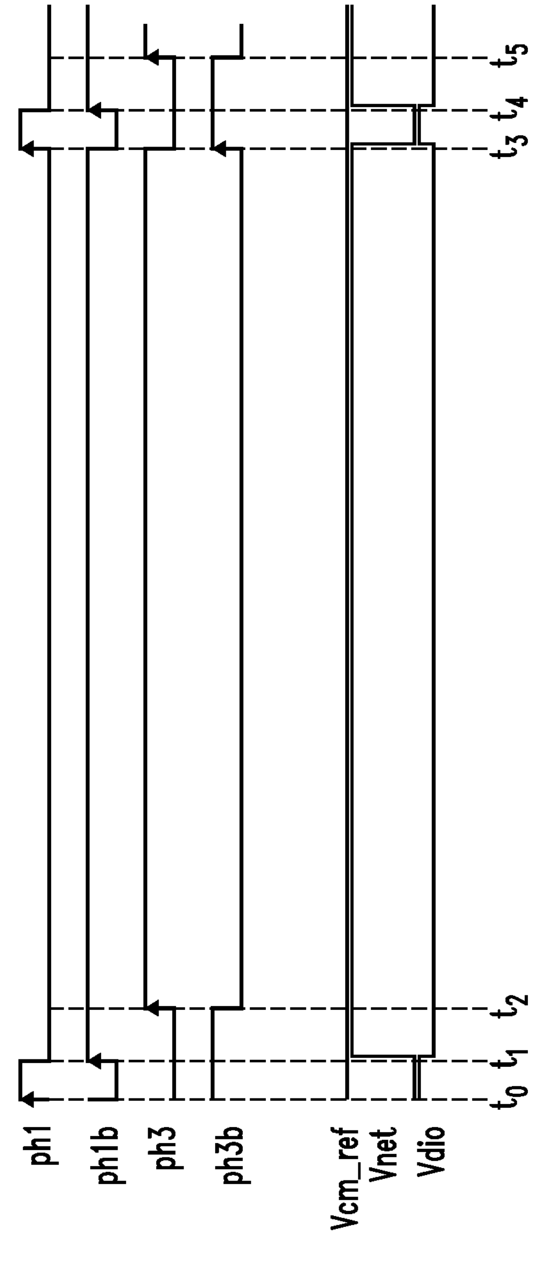
FIG. 3 shows a timing diagram illustrating the states of the four phased control signals ph1, ph1*b*, ph3, and ph3*b* and the relative levels of the three analog voltages Vcm_ref, Vnet, and Vdio in the circuit of FIG. 2.

FIG. 3 shows a timing diagram illustrating the states of the four phased control signals ph1, ph1*b*, ph3, and ph3*b* and the relative levels of three analog voltages Vcm_ref, Vnet, and Vdio in circuit 200, where Vcm_ref is the constant common-mode reference voltage, Vnet is the voltage at the node (referred to as node Vnet) interconnecting switches SW2, SW3, SW4, and SW5, and Vdio is the voltage at the node (referred to as node Vdio) interconnecting capacitors C1 and C2, switch SW3, and the gate of tail device Nt.

As shown in FIG. 3, between time t0 and time t1 (referred to as phase 1), ph1 and ph3*b* are high, and ph1*b* and ph3 are low. As such, during phase 1, switches SW1, SW3, SW4, and SW5 are closed, and switches SW2, SW6, and SW7 are open. In this configuration, the drain terminal of device Nt is connected to its gate terminal through closed switches SW3 and SW5. This gate-to-drain connection is known in the art as a diode connection of device Nt. During phase 1, the mirrored current through slave device Ps flows through SW4 to node Vnet and onward through SW5 and through device Nt. As such, devices Ps and Nt have the same current flowing through them, and nodes Vnet and Vdio are driven to a voltage that is consistent with this common current flowing through Nt. Note that node Vdio is the same as the bottom plate of capacitor C1 and also the same as the top plate of capacitor C2. At the same time, the common-mode reference voltage Vcm_ref is connected to the top plate of capacitor C1 through SW1. The result is that capacitors C1 and C2 are charged, with the voltage at node Vdio driven to be equal to the voltage at node Vnet, as reflected in FIG. 3. With the upper plate of capacitor C1 driven to Vcm_ref through switch SW1 and the lower plate of capacitor C1 driven to voltage Vdio (=Vnet) through switch SW3, the voltage across capacitor C1 is (Vcm_ref−Vdio). Similarly, with the upper plate of capacitor C2 driven to Vdio through switch SW3 and the lower plate of capacitor C2 connected to ground, the voltage across capacitor C2 is Vdio.

At time t1, the states of control signals ph1 and ph1*b* reverse, such that between time t1 and time t2 (referred to as phase 2), ph1*b* and ph3*b* are high, and ph1 and ph3 are low. As such, during phase 2, switches SW2, SW4, and SW5 are closed, and switches SW1, SW3, SW6, and SW7 are open. In this configuration, PMOS device Ps and NMOS device Nt form a high gain, inverting amplifier with capacitor C1 connected between amplifier input node, Vdio, and amplifier output node, Vnet. The voltages of Vdio and Vnet now move in opposite directions to accommodate the voltage (Vcm_ref−Vdio) that is stored across the plates of capacitor C1. As a result of the high negative gain of the inverting amplifier, the voltage of node Vdio moves very little while the voltage of node Vnet moves much more. As such, once all voltages have settled to a steady state, the voltage of Vdio remains almost the same as in the previous phase 1, while the voltage of Vnet is almost exactly equal to the voltage Vcm_ref. Note that, at time t2, the current flowing through device Nt is still the same current that flows through device Ps.

Note that the very small change in the voltage of Vdio results in a corresponding very small change, delta Q, in the charge stored in capacitor C2. Since C1 and C2 are connected in series, C1 also experiences the same very small change, delta Q, in the charge stored in capacitor C1. In a preferred implementation, capacitor C1 is sufficiently larger than capacitor C2, such that, this small delta Q charge causes a negligible change in the voltage across the plates of capacitor C1. Note that capacitor sizes are highly specific to the technology used, and VLSI technologies evolve rapidly over the years. Also, capacitor sizes can vary depending on the particular application without departing from the scope of this invention. In particular, in some applications, it may be appropriate to not have an explicit capacitor C2 at all, and to instead rely on the parasitic capacitance to ground at node Vdio to store the necessary charge to maintain a fixed Vdio voltage during phase 3.

At time t2, the states of control signals ph3 and ph3*b* reverse, such that between time t2 and time t3 (referred to as phase 3), ph1*b* and ph3 are high, and ph1 and ph3*b* are low. As such, during phase 3, switches SW2, SW6, and SW7 are closed, and switches SW1, SW3, SW4, and SW5 are open. As such, during phase 3, the current through slave device Ps is directed through switch SW6 as output source current Isource for circuit 200. Similarly, during phase 3, the current through tail device Nt established during phase 2, which has the same magnitude as the current through slave device Ps, is directed through switch SW7 as output sink current Isink for circuit 200. In phase 3, the top plate of capacitor C1 (which is connected to node Vnet through switch SW2) is isolated by switches SW1, SW4, and SW5. The voltage at the top plate of capacitor C2, node Vdio, (which is connected to the gate terminal of Nt) is held constant by the charge stored in capacitor C2. The voltages of the gates of Ps and Nt remain the same in phase 3 as they were at the end of phase 2. In phase 2, the equal currents through device Ps and device Nt were established with the drain voltages of Ps and Nt equal to Vcm_ref. This voltage Vcm_ref was chosen to be the fixed common-mode voltage of the output nodes, Isource and Isink, connected to switches SW6 and SW7. Thus, during phase 3, the gate voltages of Ps and Nt remain fixed, the drain voltages of Ps and Nt experience equal shifts from the voltage Vcm_ref, and the magnitude of the source current Isource remains equal to the magnitude of the sink current Isink throughout phase 3. During phase 3, the circuit outputs a matched pair of differential currents, Isource and Isink In a real-world implementation, it is conventional to periodically repeat the charging of the capacitors and the automatic adjustment of gate voltage Vdio, in order to refresh any charge that may have leaked over time from capacitor C2. FIG. 3 reflects this periodic re-charging and re-adjustment between times t3 and t5, where the scenario of the phased control signals that occurred during phases 1 and 2 and the corresponding effects on voltages Vnet and Vdio are repeated. As indicated in FIG. 3, the duration of phase 3 (e.g., a few microseconds) is preferably much longer than the duration of phases 1 and 2 combined (e.g., a few nanoseconds). The durations of phases 1, 2, and 3 can vary depending on the particular application without departing from the scope of this invention.

In an alternative embodiment, the PMOS devices Pm and Ps and NMOS device Nt may each be substituted by a pair of cascoded devices to improve output impedance without departing from the scope of this invention.

This disclosure is described with a current mirror, formed by Pm and Ps, used to generate the Isource current. It will be understood by those skilled in the art that the Pm/Ps current mirror can be replaced by any other suitable constant-current generator for generating a constant source current without departing from the scope of this invention, such as (without limitation) a current-steering DAC and a bandgap and opamp-based reference current source.

Although the disclosure is described in the context of an embodiment in which a current mirror is implemented using PMOS devices, where the current through an NMOS tail device is self-calibrated to match the mirrored current through the PMOS slave device, those skilled in the art will understand that, in an alternative embodiment, the current mirror can be implemented using NMOS devices with the current through a PMOS "head" device being self-calibrated to match the mirrored current through the NMOS slave device. In general, the NMOS tail device of the previous embodiment and the PMOS head device of the latter embodiment may be referred to generically as "dependent" devices, because the currents through those devices depend upon the current through the slave device of the corresponding current mirror.

In general, self-calibrating differential current circuit 200 of FIG. 2 may be said to generate a source current at a source current node (i.e., Isource) and a sink current at a sink current node (i.e., Isink), where the differential current circuit comprises a current mirror (i.e., Pm and Ps), a dependent device (i.e., Nt), and a switched capacitor circuit (i.e., switches SW1-SW7 and capacitors C1 and C2). The current mirror has a master device (i.e., Pm) configured to a slave device (i.e., Ps), where a master current through the master device is mirrored by a slave current through the slave device. The dependent device is connected in series with the slave device such that (i) one of the source current node and the sink current node (i.e., Isource) is connected to the drain of the slave device and (ii) the other of the source current node and the sink current node (i.e., Isink) is connected to the drain of the dependent device. The switched capacitor circuit is connected to the gate of the dependent device, where the switched capacitor circuit is configured to be operated to (i) charge at least one capacitor (i.e., both capacitors C1 and C2) of the switched capacitor circuit, (ii) use the at least one charged capacitor (i.e., both capacitors C1 and C2) to adjust the gate voltage of the dependent device to drive the dependent current through the dependent device to be equal to the slave current through the slave device, and (iii) direct the dependent and slave currents through the source and sink current nodes.

During a first operating phase (i.e., phase 1), the switched circuit is configured to (i) drive both the drain voltage of the slave device and the drain voltage of the dependent device to the gate voltage (i.e., Vdio) of the dependent device and (ii) charge the first and second capacitors such that the gate voltage of the dependent device sets the dependent current through the dependent device equal to the slave current through the slave device. The first capacitor stores charge corresponding to (Vcm_ref−Vdio) voltage across its plates, and the second capacitor stores charge corresponding to Vdio voltage across its plates.

During a second operating phase (i.e., phase 2), the switched circuit is configured to (i) disconnect the gate voltage of the dependent device from the drain voltages of the slave and dependent devices, and (ii) connect one of the capacitors (i.e., capacitor C1) between the gate and drain terminals of the dependent device, such that the first and second capacitors force the drain voltages of the slave and dependant devices to be equal to the Vcm_ref voltage and adjust the gate voltage of the dependent device to continue to set the dependent current through the dependent device equal to the slave current through the slave device.

During a third operating phase (i.e., phase 3), the switched circuit is configured to (i) disconnect the drain of the slave device from the drain of the dependent device, (ii) connect the drain of the slave device to one of the source current node and the sink current node, and (iii) connect the drain of the dependent device to the other of the source current node and the sink current node.

Although FIG. 2 does not show the control circuitry used to generate the phased control signals ph1, ph1*b*, ph3, and ph3*b*, those skilled in the art will understand that those phased control signals may be generated using any suitable analog, digital, or a hybrid of both analog and digital circuit-based processes.

Although FIG. 2 does not show the devices used to implement the switches, SW1, SW2, SW3, SW4, SW5, SW6, and SW7, those skilled in the art will understand that these switches can be implemented in any of several ways that are common knowledge in the art, without departing from the scope of this invention.

Although FIG. 2 does not show the circuitry used to generate the fixed Vcm_ref voltage that is equal to the fixed average of the output voltages, V_Isource and V_Isink, those skilled in the art will understand that Vcm_ref may be generated using any suitable circuit-based process.

In general, self-calibrating differential current circuits of the disclosure may be implemented as circuit-based processes, including possible implementation in a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, general-purpose computer, or other processor.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts (e.g., if appropriate, circuits, sub-circuits, and components) which have been described and illustrated in order to explain embodiments of the invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit having a differential current circuit for generating a source current at a source current node and a sink current at a sink current node, the differential current circuit comprising:

a constant-current generator adapted to generate a constant current;

a dependent device such that (i) one of the source current and the sink current is the constant current and (ii) the other of the source current and the sink current is a dependent current through the dependent device; and a switched capacitor circuit connected to a gate of the dependent device, wherein the switched capacitor circuit is configured to be operated to (i) charge at least one capacitor of the switched capacitor circuit, (ii) use the at least one charged capacitor to adjust a gate voltage of the dependent device to drive the dependent current through the dependent device to be equal to the constant current through the constant-current generator, and (iii) direct the dependent and constant currents through the source and sink current nodes.

2. The invention of claim 1, wherein the source current and the sink current have equal magnitudes.

3. The invention of claim 1, wherein the switched capacitor circuit includes a first capacitor connected between a common-mode reference node and the gate of the dependent device.

4. The invention of claim 3, wherein:

during a first operating phase, the switched circuit is configured to (i) connect the constant-current generator and the dependent device in series, (ii) drive the gate voltage of the dependent device to the voltage of a network node connecting an output of the constant-current generator and an output of the dependent device, and (iii) charge the first capacitor such that (a) the gate voltage of the dependent device sets the dependent current through the dependent device equal to the constant current through the constant-current generator and (b) the first capacitor stores charge across its plates corresponding to a voltage difference between the voltage at the common-mode reference node and the gate voltage;

during a second operating phase, the switched circuit is configured to (i) disconnect the gate of the dependent device from the network node and (ii) connect the first capacitor between the gate of the dependent device and the network node, such that the first capacitor forces the voltage of the network node to be equal to the common-mode reference voltage and adjusts the gate voltage of the dependent device to continue to set the dependent current through the dependent device equal to the constant current through the constant-current generator; and during a third operating phase, the switched circuit is configured to (i) disconnect the constant-current generator from the output node of the dependent device, (ii) connect the constant-current generator to one of the source current node and the sink current node, and (iii) connect the output of the dependent device to the other of the source current node and the sink current node.

5. The invention of claim 1, wherein:

the dependent device is an N-type tail device;

the source current node is connected to the output of the constant-current generator;

the sink current node is connected to the drain of the tail device; and the switched capacitor circuit is connected to the gate of the tail device, wherein:

a first capacitor is connected between a common-mode reference node Vcm_ref and the gate of the tail device; and a second capacitor is connected between the gate of the tail device and ground;

during a first operating phase, the switched circuit is configured to (i) drive both the output voltage of the constant-current generator and the drain voltage of the tail device to the gate voltage Vdio of the tail device and (ii) charge the first and second capacitors such that (a) the gate voltage Vdio of the tail device sets a tail current through the tail device equal to the constant current through the constant-current generator, (b) the first capacitor stores charge corresponding to (Vcm_ref–Vdio) voltage across its plates, and (c) the second capacitor stores charge corresponding to Vdio voltage across its plates;

during a second operating phase, the switched circuit is configured to (i) cease charging the capacitors, (ii) disconnect the gate of the tail device from a network node Vnet of the constant-current generator and the tail device, and (iii) connect one of the capacitors between the gate and drain terminals of the dependent device, such that the first and second capacitors (a) force the output voltages of the constant-current generator and dependant device to be equal to the Vcm_ref voltage and (b) adjust the gate voltage of the tail device to continue to set the tail current through the tail device equal to the constant current through the constant-current generator; and during a third operating phase, the switched circuit is configured to (i) disconnect the output of the constant-current generator from the drain of the tail device, (ii) connect the output of the constant-current generator to the source current node, and (iii) connect the drain of the tail device to the sink current node.

6. The invention of claim 5, wherein the first capacitor is sufficiently larger than the second capacitor such that, during the second operating phase, the adjustment to the gate voltage of the tail device affects the voltage across the second capacitor more than the voltage across the first capacitor, wherein the outputs of the constant-current generator and the tail device are driven to the common-mode reference voltage.

7. The invention of claim 5, wherein:

a first switch is connected between the common-mode reference node and a first plate of the first capacitor;

a second switch is connected between the first plate of the first capacitor and the network node Vnet;

a third switch is connected between the gate of the tail device and the network node;

a second plate of the first capacitor is connected to a first plate of the second capacitor and to the gate of the tail device;

a fourth switch is connected between the output of the constant-current generator and the network node;

a fifth switch is connected between the network node and the drain of the tail device;

a sixth switch is connected between the output of the constant-current generator and the source current node; and a seventh switch is connected between the drain of the tail device and the sink current node.

8. The invention of claim 7, wherein:

during the first phase, (i) the first, third, fourth, and fifth switches are closed and (ii) the second, sixth, and seventh switches are open;

during the second phase, (i) the second, fourth, and fifth switches are closed and (ii) the first, third, sixth, and seventh switches are open; and during the third phase, (i) the second, sixth, and seventh switches are closed and (ii) the first, third, fourth, and fifth switches are open.

9. The invention of claim 1, wherein the constant-current generator is a current mirror having a master device configured to a slave device, wherein the constant current is a slave current through the slave device that mirrors a master current through the master device.

10. The invention of claim 9, wherein:

the master device is a diode-connected P-type transistor; and the slave device is a P-type transistor.

* * * * *